United States Patent
Kim et al.

(10) Patent No.: US 9,743,553 B2
(45) Date of Patent: Aug. 22, 2017

(54) MOBILE TERMINAL

(71) Applicant: LG ELECTRONICS INC., Seoul (KR)

(72) Inventors: Byungsoo Kim, Seoul (KR); Joseph Lee, Seoul (KR); Kyungui Park, Seoul (KR); Wonkee Ahn, Seoul (KR); Donghyun Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 303 days.

(21) Appl. No.: 14/559,616

(22) Filed: Dec. 3, 2014

(65) Prior Publication Data

US 2015/0342089 A1 Nov. 26, 2015

(30) Foreign Application Priority Data

May 26, 2014 (KR) .................. 10-2014-0063203

(51) Int. Cl.
*H05K 7/20* (2006.01)
*H04M 1/02* (2006.01)

(52) U.S. Cl.
CPC ......... *H05K 7/20336* (2013.01); *H04M 1/026* (2013.01)

(58) Field of Classification Search
None
See application file for complete search history.

(56) References Cited

U.S. PATENT DOCUMENTS

| | | | |
|---|---|---|---|
| 7,626,820 B1* | 12/2009 | Konshak | H05K 7/20672 165/104.33 |
| 8,570,749 B2* | 10/2013 | Tissot | H05K 7/20809 174/548 |
| 9,307,629 B2* | 4/2016 | Tissot | |
| 2006/0044760 A1* | 3/2006 | Pal | H05K 7/20672 361/700 |
| 2008/0019102 A1* | 1/2008 | Yurko | H05K 7/1404 361/719 |
| 2010/0002395 A1* | 1/2010 | Bertrou | H05K 7/20672 361/700 |
| 2011/0141692 A1* | 6/2011 | Bult | H05K 7/1404 361/700 |
| 2016/0037681 A1* | 2/2016 | Lee | H04B 1/036 455/556.1 |

* cited by examiner

*Primary Examiner* — Courtney Smith
(74) *Attorney, Agent, or Firm* — Dentons US LLP

(57) ABSTRACT

A mobile terminal having a structure increasing heat dissipation efficiency, including a printed circuit board (PCB) disposed within a terminal body and having a heating element which generates heat mounted thereon, a frame having a space formed on one surface thereof and allowing the PCB to be installed therein, and a heat pipe supported by the frame, disposed on one surface of the frame, and connected to the PCB to dissipate heat generated by the heating element outwardly from the terminal body, wherein the frame includes a hold portion extending from an end portion thereof to cover at least a portion of the heat pipe in order to prevent the heat pipe from being released from the frame by external force applied to the terminal body.

17 Claims, 10 Drawing Sheets

MOBILE TERMINAL

CROSS-REFERENCE TO RELATED APPLICATION

Pursuant to 35 U.S.C. §119(a), this application claims the benefit of earlier filing date and right of priority to Korean Application No. 10-2014-0063203, filed on May 26, 2014, the contents of which is incorporated by reference herein in its entirety.

BACKGROUND OF THE INVENTION

1. Field of the Invention

The present disclosure relates to a mobile terminal having a structure capable of enhancing heat dissipation efficiency.

2. Background of the Invention

Terminals may be generally classified as mobile/portable terminals or stationary terminals according to their mobility. Mobile terminals may also be classified as handheld terminals or vehicle mounted terminals according to whether or not a user can directly carry the terminal.

Mobile terminals have become increasingly more functional. Examples of such functions include data and voice communications, capturing images and video via a camera, recording audio, playing music files via a speaker system, and displaying images and video on a display. Some mobile terminals include additional functionality which supports game playing, while other terminals are configured as multimedia players. More recently, mobile terminals have been configured to receive broadcast and multicast signals which permit viewing of content such as videos and television programs.

Efforts are ongoing to support and increase the functionality of mobile terminals. Such efforts include software and hardware improvements, as well as changes and improvements in the structural components.

To execute various functions, components such as an application processor (AP), a power management integrated circuit (PMIC), and the like, are installed in terminals, and a structure for mobile terminals capable of preventing degradation of terminal performance due to heat generated by the components has been researched.

SUMMARY OF THE INVENTION

Therefore, an aspect of the detailed description is to provide a mobile terminal in which heat generated by a heating element is quickly and stably dissipated outwardly.

Another aspect of the detailed description is to provide a mobile terminal including a heat pipe having a stable structure not to be released even for external impact.

To achieve these and other advantages and in accordance with the purpose of this specification, as embodied and broadly described herein, a mobile terminal includes: a printed circuit board (PCB) disposed within a terminal body and having a heating element which generates heat mounted thereon; a frame having a space formed on one surface thereof and allowing the PCB to be installed therein; and a heat pipe supported by the frame, disposed on one surface of the frame, and connected to the PCB to dissipate heat generated by the heating element outwardly from the terminal body, wherein the frame includes a hold portion extending from an end portion thereof to cover at least a portion of the heat pipe in order to prevent the heat pipe from being released from the frame by external force applied to the terminal body.

The frame may include a base portion disposed to be parallel with a front surface of the terminal body, and the hold portion may be bent from the base portion at a predetermined angle and extend.

The base portion and the hold portion may supportedly accommodate the heat pipe.

The hold portion may be in contact with the heat pipe in at least three directions perpendicular to each other, and extend to cover the heat pipe.

The frame may be formed of a metal to transmit heat transmitted from the heating element to the heat pipe.

The hold portion may extend in at least one direction of the frame such that the area in which the frame and the heat pipe are in contact is increased.

The hold portion and the heat pipe may be provided on both end portions of the frame.

A thermal grease may be disposed between the frame and the heat pipe such that the heat pipe and the frame may be attached and transmit heat to each other.

Both ends of the PCB may be supported by the heat pip and disposed on one surface of the base portion such that the PCB is spaced apart from the base portion by a predetermined interval.

A heat transmission portion may be interposed between the heating element and the frame to transmit heat generated by the heating element to the frame.

An elastic member may be interposed between the PCB and the heat pipe and formed to be elastically deformed to absorb external force.

The elastic member may be silicon as a thermal conductor to transmit heat from the PCB to the heat pipe.

The hold portion may include an extending portion extending from at least one end portion of the frame in one direction, in a direction different from the one direction of the frame.

The hold portion may be any one of first and second hold portions formed to be spaced apart from one another at both end portions of the frame in the different direction.

In order to effectively dissipate heat transmitted from the heating element outwardly from the terminal body, the first and second hold portions may be formed to be symmetrical based on any one axis.

A hair pin portion configured to be repeatedly concave and convex may be formed on a surface of the hold portion in order to increase heat transmission efficiency between the heat pipe and the terminal through the hold portion.

The hair pin portion may form a portion of an appearance of the terminal body.

The mobile terminal may further include a rear cover disposed below the PCB and coupled to the hold portion.

The rear cover may be in contact with the heat pipe to transmit heat generated by the heating element to the heat pipe.

The heating element may include a first heating element mounted on a surface facing the frame; and a second heating element mounted on a surface facing the rear cover, wherein the second heating element and the rear cover may be in contact with a heat transmission portion interposed therebetween in order to allow heat generated by the second heating element to be transmitted to the rear cover.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the detailed description.

BRIEF DESCRIPTION OF THE DRAWINGS

The accompanying drawings, which are included to provide a further understanding of the invention and are incorporated in and constitute a part of this specification, illustrate exemplary embodiments and together with the description serve to explain the principles of the invention.

In the drawings.

DETAILED DESCRIPTION OF THE INVENTION

Figure 1:
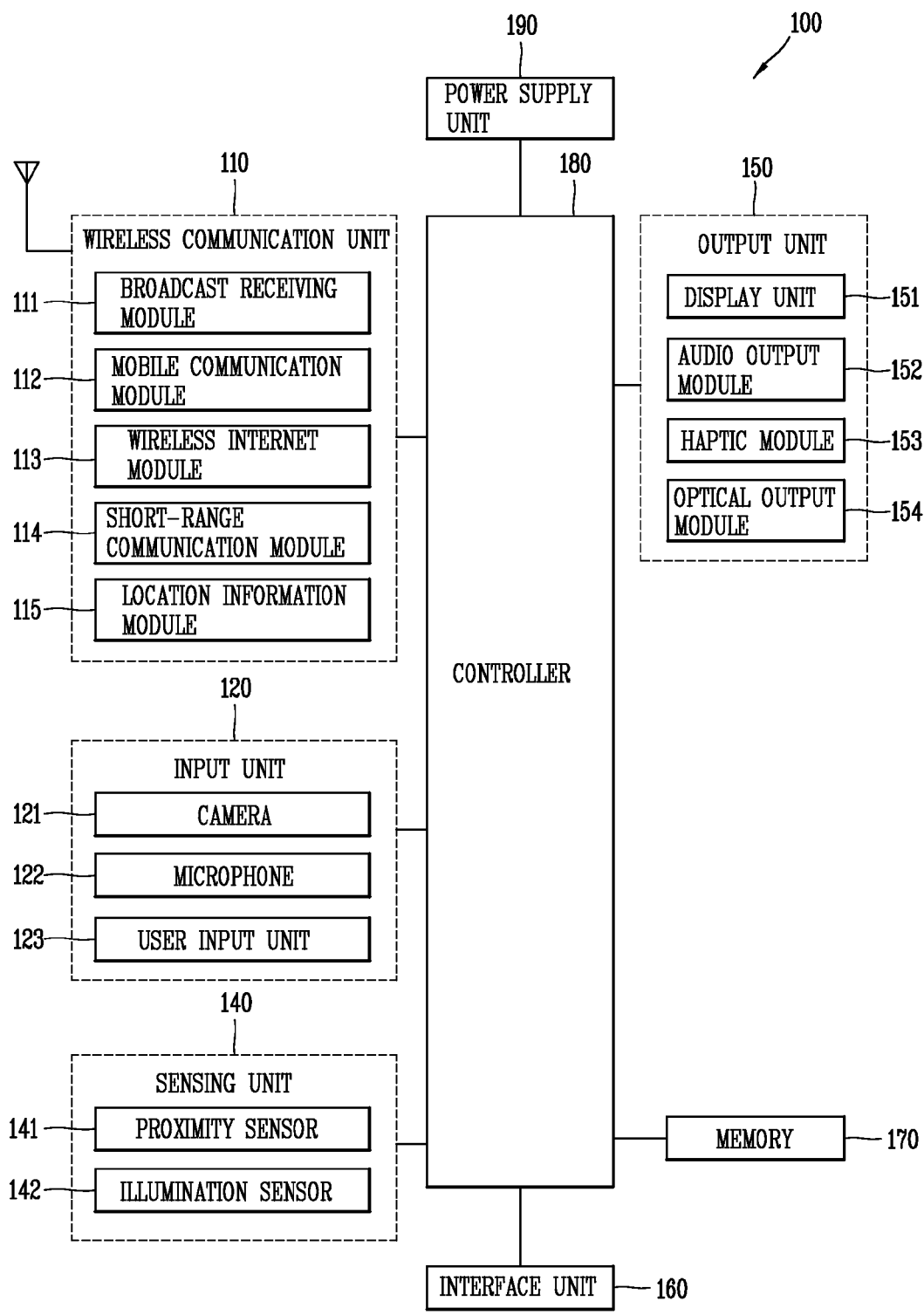
FIG. 1 is a block diagram of a mobile terminal according to an exemplary embodiment of the present disclosure.

Description will now be given in detail according to exemplary embodiments disclosed herein, with reference to the accompanying drawings. For the sake of brief description with reference to the drawings, the same or equivalent components may be provided with the same or similar reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In the present disclosure, that which is well-known to one of ordinary skill in the relevant art has generally been omitted for the sake of brevity. The accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention.

It will be understood that when an element is referred to as being "connected with" another element, it can be directly connected with the other element or intervening elements may also be present. In contrast, when an element is referred to as being "directly connected with" another element, there are no intervening elements present.

As used herein, the singular forms "a", "an" and "the" are intended to include the plural forms as well, unless the context clearly indicates otherwise.

It will be further understood that the terms "comprises" "comprising," "includes" and/or "including" when used herein, specify the presence of stated features, integers, steps, operations, elements, and/or components, but do not preclude the presence or addition of one or more other features, steps, operations, elements, components, and/or groups thereof.

Mobile terminals presented herein may be implemented using a variety of different types of terminals. Examples of such terminals include cellular phones, smart phones, user equipment, laptop computers, digital broadcast terminals, personal digital assistants (PDAs), portable multimedia players (PMPs), navigators, portable computers (PCs), slate PCs, tablet PCs, ultra books, wearable devices (for example, smart watches, smart glasses, head mounted displays (HMDs)), and the like.

By way of non-limiting example only, further description will be made with reference to particular types of mobile terminals. However, such teachings apply equally to other types of terminals, such as those types noted above. In addition, these teachings may also be applied to stationary terminals such as digital TV, desktop computers, digital signage, and the like.

Reference is now made to FIGS. 1A-1C, where FIG. 1A is a block diagram of a mobile terminal in accordance with the present disclosure, and FIGS. 1B and 1C are conceptual views of one example of the mobile terminal, viewed from different directions.

The mobile terminal 100 is shown having components such as a wireless communication unit 110, an input unit 120, a sensing unit 140, an output unit 150, an interface unit 160, a memory 170, a controller 180, and a power supply unit 190. It is understood that implementing all of the illustrated components is not a requirement, and that greater or fewer components may alternatively be implemented.

Referring now to FIG. 1A, the mobile terminal 100 is shown having wireless communication unit 110 configured with several commonly implemented components. For instance, the wireless communication unit 110 typically includes one or more components which permit wireless communication between the mobile terminal 100 and a wireless communication system or network within which the mobile terminal is located.

The wireless communication unit 110 includes one or more of a broadcast receiving module 111, a mobile communication module 112, a wireless Internet module 113, a short-range communication module 114, and a location information module 115.

The input unit 120 includes a camera 121 for obtaining images or video, a microphone 122, which is one type of audio input device for inputting an audio signal, and a user input unit 123 (for example, a touch key, a push key, a mechanical key, a soft key, and the like) for allowing a user to input information. Data (for example, audio, video, image, and the like) is obtained by the input unit 120 and may be analyzed and processed by controller 180 according to device parameters, user commands, and combinations thereof.

The sensing unit 140 is typically implemented using one or more sensors configured to sense internal information of the mobile terminal, the surrounding environment of the mobile terminal, user information, and the like. For example, in FIG. 1A, the sensing unit 140 is shown having a proximity sensor 141 and an illumination sensor 142. If desired, the sensing unit 140 may alternatively or additionally include other types of sensors or devices, such as a touch sensor, an acceleration sensor, a magnetic sensor, a G-sensor, a gyroscope sensor, a motion sensor, an RGB sensor, an infrared (IR) sensor, a finger scan sensor, a ultrasonic sensor, an optical sensor (for example, camera 121), a microphone 122, a battery gauge, an environment sensor (for example, a barometer, a hygrometer, a thermometer, a radiation detection sensor, a thermal sensor, and a gas sensor, among others), and a chemical sensor (for example, an electronic nose, a health care sensor, a biometric sensor, and the like), to name a few. The mobile terminal 100 may be configured to utilize information obtained from sensing unit 140, and in particular, information obtained from one or more sensors of the sensing unit 140, and combinations thereof.

The output unit 150 is typically configured to output various types of information, such as audio, video, tactile output, and the like. The output unit 150 is shown having a display unit 151, an audio output module 152, a haptic module 153, and an optical output module 154. The display unit 151 may have an inter-layered structure or an integrated structure with a touch sensor in order to facilitate a touch screen. The touch screen may provide an output interface between the mobile terminal 100 and a user, as well as function as the user input unit 123 which provides an input interface between the mobile terminal 100 and the user.

The interface unit 160 serves as an interface with various types of external devices that can be coupled to the mobile terminal 100. The interface unit 160, for example, may include any of wired or wireless ports, external power supply ports, wired or wireless data ports, memory card ports, ports for connecting a device having an identification module, audio input/output (I/O) ports, video I/O ports, earphone ports, and the like. In some cases, the mobile terminal 100 may perform assorted control functions associated with a connected external device, in response to the external device being connected to the interface unit 160.

The memory 170 is typically implemented to store data to support various functions or features of the mobile terminal 100. For instance, the memory 170 may be configured to store application programs executed in the mobile terminal 100, data or instructions for operations of the mobile terminal 100, and the like. Some of these application programs may be downloaded from an external server via wireless communication. Other application programs may be installed within the mobile terminal 100 at time of manufacturing or shipping, which is typically the case for basic functions of the mobile terminal 100 (for example, receiving a call, placing a call, receiving a message, sending a message, and the like). It is common for application programs to be stored in the memory 170, installed in the mobile terminal 100, and executed by the controller 180 to perform an operation (or function) for the mobile terminal 100.

In order to drive an application program stored in the memory 170, the controller 180 may control at least some of the components described above with reference to FIG. 1A. In addition, in order to drive the application program, the controller 180 may combine two or more of the components included in the mobile terminal 100 to operate the same.

The power supply unit 190 can be configured to receive external power or provide internal power in order to supply appropriate power required for operating elements and components included in the mobile terminal 100. The power supply unit 190 may include a battery, and the battery may be configured to be embedded in the terminal body, or configured to be detachable from the terminal body.

At least some of the components may be cooperatively operated to implement operations, control, or control methods of the mobile terminal according to various embodiments described hereinafter. Also, the operations, control, or control methods of the mobile terminal may be implemented in the mobile terminal by driving at least one application program stored in the memory 170.

Referring still to FIG. 1A, various components depicted in this figure will now be described in more detail.

Regarding the wireless communication unit 110, the broadcast receiving module 111 is typically configured to receive a broadcast signal and/or broadcast associated information from an external broadcast managing entity via a broadcast channel. The broadcast channel may include a satellite channel, a terrestrial channel, or both. In some embodiments, two or more broadcast receiving modules 111 may be utilized to facilitate simultaneously receiving of two or more broadcast channels, or to support switching among broadcast channels.

The mobile communication module 112 can transmit and/or receive wireless signals to and from one or more network entities. Typical examples of a network entity include a base station, an external mobile terminal, a server, and the like. Such network entities form part of a mobile communication network, which is constructed according to technical standards or communication methods for mobile communications (for example, Global System for Mobile Communication (GSM), Code Division Multi Access (CDMA), CDMA2000 (Code Division Multi Access 2000), EV-DO (Enhanced Voice-Data Optimized or Enhanced Voice-Data Only), Wideband CDMA (WCDMA), High Speed Downlink Packet access (HSDPA), HSUPA (High Speed Uplink Packet Access), Long Term Evolution (LTE), LTE-A (Long Term Evolution-Advanced), and the like).

Examples of wireless signals transmitted and/or received via the mobile communication module 112 include audio call signals, video (telephony) call signals, or various formats of data to support communication of text and multimedia messages.

The wireless Internet module 113 is configured to facilitate wireless Internet access. This module may be internally or externally coupled to the mobile terminal 100. The wireless Internet module 113 may transmit and/or receive wireless signals via communication networks according to wireless Internet technologies.

Examples of such wireless Internet access include Wireless LAN (WLAN), Wireless Fidelity (Wi-Fi), Wi-Fi Direct, Digital Living Network Alliance (DLNA), Wireless Broadband (WiBro), Worldwide Interoperability for Microwave Access (WiMAX), High Speed Downlink Packet Access (HSDPA), HSUPA (High Speed Uplink Packet Access), Long Term Evolution (LTE), LTE-A (Long Term Evolution- Advanced), and the like. The wireless Internet module 113 may transmit/receive data according to one or more of such wireless Internet technologies, and other Internet technologies as well.

In some embodiments, when the wireless Internet access is implemented according to, for example, WiBro, HSDPA, HSUPA, GSM, CDMA, WCDMA, LTE, LTE-A and the like, as part of a mobile communication network, the wireless Internet module 113 performs such wireless Internet access. As such, the Internet module 113 may cooperate with, or function as, the mobile communication module 112.

The short-range communication module 114 is configured to facilitate short-range communications. Suitable technologies for implementing such short-range communications include BLUETOOTH™, Radio Frequency IDentification (RFID), Infrared Data Association (IrDA), Ultra-WideBand (UWB), ZigBee, Near Field Communication (NFC), Wireless-Fidelity (Wi-Fi), Wi-Fi Direct, Wireless USB (Wireless Universal Serial Bus), and the like. The short-range communication module 114 in general supports wireless communications between the mobile terminal 100 and a wireless communication system, communications between the mobile terminal 100 and another mobile terminal 100, or communications between the mobile terminal and a network where another mobile terminal 100 (or an external server) is located, via wireless area networks. One example of the wireless area networks is a wireless personal area networks.

In some embodiments, another mobile terminal (which may be configured similarly to mobile terminal 100) may be a wearable device, for example, a smart watch, a smart glass or a head mounted display (HMD), which is able to exchange data with the mobile terminal 100 (or otherwise cooperate with the mobile terminal 100). The short-range communication module 114 may sense or recognize the wearable device, and permit communication between the wearable device and the mobile terminal 100. In addition, when the sensed wearable device is a device which is authenticated to communicate with the mobile terminal 100, the controller 180, for example, may cause transmission of data processed in the mobile terminal 100 to the wearable device via the short-range communication module 114. Hence, a user of the wearable device may use the data processed in the mobile terminal 100 on the wearable device. For example, when a call is received in the mobile terminal 100, the user may answer the call using the wearable device. Also, when a message is received in the mobile terminal 100, the user can check the received message using the wearable device.

The location information module 115 is generally configured to detect, calculate, derive or otherwise identify a position of the mobile terminal. As an example, the location information module 115 includes a Global Position System (GPS) module, a Wi-Fi module, or both. If desired, the location information module 115 may alternatively or additionally function with any of the other modules of the wireless communication unit 110 to obtain data related to the position of the mobile terminal. As one example, when the mobile terminal uses a GPS module, a position of the mobile terminal may be acquired using a signal sent from a GPS satellite. As another example, when the mobile terminal uses the Wi-Fi module, a position of the mobile terminal can be acquired based on information related to a wireless access point (AP) which transmits or receives a wireless signal to or from the Wi-Fi module.

The input unit 120 may be configured to permit various types of input to the mobile terminal 120. Examples of such input include audio, image, video, data, and user input.

Image and video input is often obtained using one or more cameras 121. Such cameras 121 may process image frames of still pictures or video obtained by image sensors in a video or image capture mode. The processed image frames can be displayed on the display unit 151 or stored in memory 170. In some cases, the cameras 121 may be arranged in a matrix configuration to permit a plurality of images having various angles or focal points to be input to the mobile terminal 100. As another example, the cameras 121 may be located in a stereoscopic arrangement to acquire left and right images for implementing a stereoscopic image.

The microphone 122 is generally implemented to permit audio input to the mobile terminal 100. The audio input can be processed in various manners according to a function being executed in the mobile terminal 100. If desired, the microphone 122 may include assorted noise removing algorithms to remove unwanted noise generated in the course of receiving the external audio.

The user input unit 123 is a component that permits input by a user. Such user input may enable the controller 180 to control operation of the mobile terminal 100. The user input unit 123 may include one or more of a mechanical input element (for example, a key, a button located on a front and/or rear surface or a side surface of the mobile terminal 100, a dome switch, a jog wheel, a jog switch, and the like), or a touch-sensitive input, among others. As one example, the touch-sensitive input may be a virtual key or a soft key, which is displayed on a touch screen through software processing, or a touch key which is located on the mobile terminal at a location that is other than the touch screen. On the other hand, the virtual key or the visual key may be displayed on the touch screen in various shapes, for example, graphic, text, icon, video, or a combination thereof. The user input unit 123 may recognize information sensed by the sensing unit 140, as well as by the aforementioned mechanical input means and touch type input means, as information input from a user. Accordingly, the controller 180 can control an operation of the mobile terminal 100 corresponding to the sensed information.

The sensing unit 140 is generally configured to sense one or more of internal information of the mobile terminal, surrounding environment information of the mobile terminal, user information, or the like. The controller 180 generally cooperates with the sending unit 140 to control operation of the mobile terminal 100 or execute data processing, a function or an operation associated with an application program installed in the mobile terminal based on the sensing provided by the sensing unit 140. The sensing unit 140 may be implemented using any of a variety of sensors, some of which will now be described in more detail.

The proximity sensor 141 may include a sensor to sense presence or absence of an object approaching a surface, or an object located near a surface, by using an electromagnetic field, infrared rays, or the like without a mechanical contact. The proximity sensor 141 may be arranged at an inner region of the mobile terminal covered by the touch screen, or near the touch screen.

The proximity sensor 141, for example, may include any of a transmissive type photoelectric sensor, a direct reflective type photoelectric sensor, a mirror reflective type photoelectric sensor, a high-frequency oscillation proximity sensor, a capacitance type proximity sensor, a magnetic type proximity sensor, an infrared rays proximity sensor, and the like. When the touch screen is implemented as a capacitance type, the proximity sensor 141 can sense proximity of a pointer relative to the touch screen by changes of an electromagnetic field, which is responsive to an approach of an object with conductivity. In this case, the touch screen (touch sensor) may also be categorized as a proximity sensor.

The term "proximity touch" will often be referred to herein to denote the scenario in which a pointer is positioned to be proximate to the touch screen without contacting the touch screen. The term "contact touch" will often be referred to herein to denote the scenario in which a pointer makes physical contact with the touch screen. For the position corresponding to the proximity touch of the pointer relative to the touch screen, such position will correspond to a position where the pointer is perpendicular to the touch screen. The proximity sensor 141 may sense proximity touch, and proximity touch patterns (for example, distance, direction, speed, time, position, moving status, and the like). In general, controller 180 processes data corresponding to proximity touches and proximity touch patterns sensed by the proximity sensor 141, and cause output of visual information on the touch screen. In addition, the controller 180 can control the mobile terminal 100 to execute different operations or process different data according to whether a touch with respect to a point on the touch screen is either a proximity touch or a contact touch.

A touch sensor can sense a touch applied to the touch screen, such as display unit 151, using any of a variety of touch methods. Examples of such touch methods include a resistive type, a capacitive type, an infrared type, and a magnetic field type, among others.

As one example, the touch sensor may be configured to convert changes of pressure applied to a specific part of the display unit 151, or convert capacitance occurring at a specific part of the display unit 151, into electric input signals. The touch sensor may also be configured to sense not only a touched position and a touched area, but also touch pressure and/or touch capacitance. A touch object is generally used to apply a touch input to the touch sensor. Examples of typical touch objects include a finger, a touch pen, a stylus pen, a pointer, or the like.

When a touch input is sensed by a touch sensor, corresponding signals may be transmitted to a touch controller. The touch controller may process the received signals, and then transmit corresponding data to the controller 180. Accordingly, the controller 180 may sense which region of the display unit 151 has been touched. Here, the touch controller may be a component separate from the controller 180, the controller 180, and combinations thereof.

In some embodiments, the controller 180 may execute the same or different controls according to a type of touch object that touches the touch screen or a touch key provided in addition to the touch screen. Whether to execute the same or different control according to the object which provides a touch input may be decided based on a current operating state of the mobile terminal 100 or a currently executed application program, for example.

The touch sensor and the proximity sensor may be implemented individually, or in combination, to sense various types of touches. Such touches includes a short (or tap) touch, a long touch, a multi-touch, a drag touch, a flick touch, a pinch-in touch, a pinch-out touch, a swipe touch, a hovering touch, and the like.

If desired, an ultrasonic sensor may be implemented to recognize position information relating to a touch object using ultrasonic waves. The controller 180, for example, may calculate a position of a wave generation source based on information sensed by an illumination sensor and a plurality of ultrasonic sensors. Since light is much faster than ultrasonic waves, the time for which the light reaches the optical sensor is much shorter than the time for which the ultrasonic wave reaches the ultrasonic sensor. The position of the wave generation source may be calculated using this fact. For instance, the position of the wave generation source may be calculated using the time difference from the time that the ultrasonic wave reaches the sensor based on the light as a reference signal.

The camera 121 typically includes at least one a camera sensor (CCD, CMOS etc.), a photo sensor (or image sensors), and a laser sensor.

Implementing the camera 121 with a laser sensor may allow detection of a touch of a physical object with respect to a 3D stereoscopic image. The photo sensor may be laminated on, or overlapped with, the display device. The photo sensor may be configured to scan movement of the physical object in proximity to the touch screen. In more detail, the photo sensor may include photo diodes and transistors at rows and columns to scan content received at the photo sensor using an electrical signal which changes according to the quantity of applied light. Namely, the photo sensor may calculate the coordinates of the physical object according to variation of light to thus obtain position information of the physical object.

The display unit 151 is generally configured to output information processed in the mobile terminal 100. For example, the display unit 151 may display execution screen information of an application program executing at the mobile terminal 100 or user interface (UI) and graphic user interface (GUI) information in response to the execution screen information.

In some embodiments, the display unit 151 may be implemented as a stereoscopic display unit for displaying stereoscopic images. A typical stereoscopic display unit may employ a stereoscopic display scheme such as a stereoscopic scheme (a glass scheme), an auto-stereoscopic scheme (glassless scheme), a projection scheme (holographic scheme), or the like.

The audio output module 152 is generally configured to output audio data. Such audio data may be obtained from any of a number of different sources, such that the audio data may be received from the wireless communication unit 110 or may have been stored in the memory 170. The audio data may be output during modes such as a signal reception mode, a call mode, a record mode, a voice recognition mode, a broadcast reception mode, and the like. The audio output module 152 can provide audible output related to a particular function (e.g., a call signal reception sound, a message reception sound, etc.) performed by the mobile terminal 100. The audio output module 152 may also be implemented as a receiver, a speaker, a buzzer, or the like.

A haptic module 153 can be configured to generate various tactile effects that a user feels, perceive, or otherwise experience. A typical example of a tactile effect generated by the haptic module 153 is vibration. The strength, pattern and the like of the vibration generated by the haptic module 153 can be controlled by user selection or setting by the controller. For example, the haptic module 153 may output different vibrations in a combining manner or a sequential manner.

Besides vibration, the haptic module 153 can generate various other tactile effects, including an effect by stimulation such as a pin arrangement vertically moving to contact skin, a spray force or suction force of air through a jet orifice or a suction opening, a touch to the skin, a contact of an electrode, electrostatic force, an effect by reproducing the sense of cold and warmth using an element that can absorb or generate heat, and the like.

The haptic module 153 can also be implemented to allow the user to feel a tactile effect through a muscle sensation such as the user's fingers or arm, as well as transferring the tactile effect through direct contact. Two or more haptic modules 153 may be provided according to the particular configuration of the mobile terminal 100.

An optical output module 154 can output a signal for indicating an event generation using light of a light source. Examples of events generated in the mobile terminal 100 may include message reception, call signal reception, a missed call, an alarm, a schedule notice, an email reception, information reception through an application, and the like.

A signal output by the optical output module 154 may be implemented in such a manner that the mobile terminal emits monochromatic light or light with a plurality of colors. The signal output may be terminated as the mobile terminal senses that a user has checked the generated event, for example.

The interface unit 160 serves as an interface for external devices to be connected with the mobile terminal 100. For example, the interface unit 160 can receive data transmitted from an external device, receive power to transfer to elements and components within the mobile terminal 100, or transmit internal data of the mobile terminal 100 to such external device. The interface unit 160 may include wired or wireless headset ports, external power supply ports, wired or wireless data ports, memory card ports, ports for connecting a device having an identification module, audio input/output (I/O) ports, video I/O ports, earphone ports, or the like.

The identification module may be a chip that stores various information for authenticating authority of using the mobile terminal 100 and may include a user identity module (UIM), a subscriber identity module (SIM), a universal subscriber identity module (USIM), and the like. In addition, the device having the identification module (also referred to herein as an "identifying device") may take the form of a smart card. Accordingly, the identifying device can be connected with the terminal 100 via the interface unit 160.

When the mobile terminal 100 is connected with an external cradle, the interface unit 160 can serve as a passage to allow power from the cradle to be supplied to the mobile terminal 100 or may serve as a passage to allow various command signals input by the user from the cradle to be transferred to the mobile terminal there through. Various command signals or power input from the cradle may operate as signals for recognizing that the mobile terminal is properly mounted on the cradle.

The memory 170 can store programs to support operations of the controller 180 and store input/output data (for example, phonebook, messages, still images, videos, etc.). The memory 170 may store data related to various patterns of vibrations and audio which are output in response to touch inputs on the touch screen.

The memory 170 may include one or more types of storage mediums including a Flash memory, a hard disk, a solid state disk, a silicon disk, a multimedia card micro type, a card-type memory (e.g., SD or DX memory, etc), a Random Access Memory (RAM), a Static Random Access Memory (SRAM), a Read-Only Memory (ROM), an Electrically Erasable Programmable Read-Only Memory (EEPROM), a Programmable Read-Only memory (PROM), a magnetic memory, a magnetic disk, an optical disk, and the like. The mobile terminal 100 may also be operated in relation to a network storage device that performs the storage function of the memory 170 over a network, such as the Internet.

The controller 180 may typically control the general operations of the mobile terminal 100. For example, the controller 180 may set or release a lock state for restricting a user from inputting a control command with respect to applications when a status of the mobile terminal meets a preset condition.

The controller 180 can also perform the controlling and processing associated with voice calls, data communications, video calls, and the like, or perform pattern recognition processing to recognize a handwriting input or a picture drawing input performed on the touch screen as characters or images, respectively. In addition, the controller 180 can control one or a combination of those components in order to implement various exemplary embodiments disclosed herein.

The power supply unit 190 receives external power or provide internal power and supply the appropriate power required for operating respective elements and components included in the mobile terminal 100. The power supply unit 190 may include a battery, which is typically rechargeable or be detachably coupled to the terminal body for charging.

The power supply unit 190 may include a connection port. The connection port may be configured as one example of the interface unit 160 to which an external charger for supplying power to recharge the battery is electrically connected.

As another example, the power supply unit 190 may be configured to recharge the battery in a wireless manner without use of the connection port. In this example, the power supply unit 190 can receive power, transferred from an external wireless power transmitter, using at least one of an inductive coupling method which is based on magnetic induction or a magnetic resonance coupling method which is based on electromagnetic resonance.

Various embodiments described herein may be implemented in a computer-readable medium, a machine-readable medium, or similar medium using, for example, software, hardware, or any combination thereof.

Referring now to FIGS. 1B and 1C, the mobile terminal 100 is described with reference to a bar-type terminal body. However, the mobile terminal 100 may alternatively be implemented in any of a variety of different configurations. Examples of such configurations include watch-type, clip-type, glasses-type, or as a folder-type, flip-type, slide-type, swing-type, and swivel-type in which two and more bodies are combined with each other in a relatively movable manner, and combinations thereof. Discussion herein will often relate to a particular type of mobile terminal Here, the terminal body may be understood as having a concept designating the mobile terminal 100 as at least one aggregation.

The mobile terminal 100 will generally include a case (for example, frame, housing, cover, and the like) forming the appearance of the terminal. In this embodiment, the case is formed using a front case 101 and a rear case 102. Various electronic components are incorporated into a space formed between the front case 101 and the rear case 102. At least one middle case may be additionally positioned between the front case 101 and the rear case 102.

The display unit 151 is shown located on the front side of the terminal body to output information. As illustrated, a window 151a of the display unit 151 may be mounted to the front case 101 to form the front surface of the terminal body together with the front case 101.

In some embodiments, electronic components may also be mounted to the rear case 102. Examples of such electronic components include a detachable battery 191, an identification module, a memory card, and the like. Rear cover 103 is shown covering the electronic components, and this cover may be detachably coupled to the rear case 102. Therefore, when the rear cover 103 is detached from the rear case 102, the electronic components mounted to the rear case 102 are externally exposed.

As illustrated, when the rear cover 103 is coupled to the rear case 102, a side surface of the rear case 102 is partially exposed. In some cases, upon the coupling, the rear case 102 may also be completely shielded by the rear cover 103. In some embodiments, the rear cover 103 may include an opening for externally exposing a camera 121b or an audio output module 152b.

The cases 101, 102, 103 may be formed by injection-molding synthetic resin or may be formed of a metal, for example, stainless steel (STS), aluminum (Al), titanium (Ti), or the like.

As an alternative to the example in which the plurality of cases form an inner space for accommodating components, the mobile terminal 100 may be configured such that one case forms the inner space. In this example, a mobile terminal 100 having a uni-body is formed in such a manner that synthetic resin or metal extends from a side surface to a rear surface.

If desired, the mobile terminal 100 may include a waterproofing unit (not shown) for preventing introduction of water into the terminal body. For example, the waterproofing unit may include a waterproofing member which is located between the window 151a and the front case 101, between the front case 101 and the rear case 102, or between the rear case 102 and the rear cover 103, to hermetically seal an inner space when those cases are coupled.

The mobile terminal 100 may include the display unit 151, first and second audio output units 152a and 152b, the proximity sensor 141, an illumination sensor 142, a light output unit 154, first and second cameras 121a and 121b, first and second manipulation units 123a and 123b, a microphone 122, an interface unit 160, and the like.

Hereinafter, as illustrated in FIGS. 1B and 1C, the mobile terminal 100 in which the display unit 151, the first audio output unit 152a, the proximity sensor 141, the illumination sensor 142, the light output unit 154, the first camera 121a, and the first manipulation unit 123a are disposed on a front surface of the terminal body, the second manipulation unit 123b, the microphone 122, and the interface unit 160 are disposed on the side of the terminal body, and the second audio output unit 152b and the second camera 121b are disposed on a rear surface of the terminal body will be described as an example.

However, the components are not limited to the configuration. The components may be excluded, replaced, or disposed on other surfaces as needed. For example, the first manipulation unit 123a may not be provided on the front surface of the terminal body, and the second audio output unit 152b may be provided on the side of the terminal body, rather than on the rear surface of the terminal body.

The display unit 151 may display (or output) information processed in the mobile terminal 100. For example, the display unit 151 may display executed screen information of an application program driven in the mobile terminal 100, or user interface (UI) information or graphic user interface (GUI) information according to the executed screen information.

The display unit 151 may include a liquid crystal display (LCD), a thin film transistor-liquid crystal display (TFT-LCD), an organic light emitting diode (OLED), a flexible display, a 3-dimensional (3D) display, and an e-ink display.

The display unit 151 may be implemented using two display devices, which can implement the same or different display technology. For instance, a plurality of the display units 151 may be arranged on one side, either spaced apart from each other, or these devices may be integrated, or these devices may be arranged on different surfaces.

The display unit 151 may also include a touch sensor which senses a touch input received at the display unit. When a touch is input to the display unit 151, the touch sensor may be configured to sense this touch and the controller 180, for example, may generate a control command or other signal corresponding to the touch. The content which is input in the touching manner may be a text or numerical value, or a menu item which can be indicated or designated in various modes.

The touch sensor may be configured in a form of a film having a touch pattern, disposed between the window 151a and a display on a rear surface of the window 151a, or a metal wire which is patterned directly on the rear surface of the window 151a. Alternatively, the touch sensor may be integrally formed with the display. For example, the touch sensor may be disposed on a substrate of the display or within the display.

The display unit 151 may also form a touch screen together with the touch sensor. Here, the touch screen may serve as the user input unit 123 (see FIG. 1A). Therefore, the touch screen may replace at least some of the functions of the first manipulation unit 123a.

The first audio output module 152a may be implemented in the form of a receiver and the second audio output unit 152b may be implemented in the form of a loud speaker to output voice audio, alarm sounds, multimedia audio reproduction, and the like.

The window 151a of the display unit 151 will typically include an aperture to permit audio generated by the first audio output module 152a to pass. One alternative is to allow audio to be released along an assembly gap between the structural bodies (for example, a gap between the window 151a and the front case 101). In this case, a hole independently formed to output audio sounds may not be seen or is otherwise hidden in terms of appearance, thereby further simplifying the appearance and manufacturing of the mobile terminal 100.

The optical output module 154 can be configured to output light for indicating an event generation. Examples of such events include a message reception, a call signal reception, a missed call, an alarm, a schedule notice, an email reception, information reception through an application, and the like. When a user has checked a generated event, the controller can control the optical output unit 154 to stop the light output.

The first camera 121a can process image frames such as still or moving images obtained by the image sensor in a capture mode or a video call mode. The processed image frames can then be displayed on the display unit 151 or stored in the memory 170.

The first and second manipulation units 123a and 123b are examples of the user input unit 123, which may be manipulated by a user to provide input to the mobile terminal 100. The first and second manipulation units 123a and 123b may also be commonly referred to as a manipulating portion, and may employ any tactile method that allows the user to perform manipulation such as touch, push, scroll, or the like. The first and second manipulation units 123a and 123b may also employ any non-tactile method that allows the user to perform manipulation such as proximity touch, hovering, or the like.

FIG. 1B illustrates the first manipulation unit 123a as a touch key, but possible alternatives include a mechanical key, a push key, a touch key, and combinations thereof.

Input received at the first and second manipulation units 123a and 123b may be used in various ways. For example, the first manipulation unit 123a may be used by the user to provide an input to a menu, home key, cancel, search, or the like, and the second manipulation unit 123b may be used by the user to provide an input to control a volume level being output from the first or second audio output modules 152a or 152b, to switch to a touch recognition mode of the display unit 151, or the like.

As another example of the user input unit 123, a rear input unit (not shown) may be located on the rear surface of the terminal body. The rear input unit can be manipulated by a user to provide input to the mobile terminal 100. The input may be used in a variety of different ways. For example, the rear input unit may be used by the user to provide an input for power on/off, start, end, scroll, control volume level being output from the first or second audio output modules 152a or 152b, switch to a touch recognition mode of the display unit 151, and the like. The rear input unit may be configured to permit touch input, a push input, or combinations thereof.

The rear input unit may be located to overlap the display unit 151 of the front side in a thickness direction of the terminal body. As one example, the rear input unit may be located on an upper end portion of the rear side of the terminal body such that a user can easily manipulate it using a forefinger when the user grabs the terminal body with one hand. However, the present disclosure is not limited thereto and a position of the rear input unit may be modified.

When the rear input unit is provided on the rear surface of the terminal body, a new user interface may be implemented. Also, when the touch screen or the rear input unit as described above replaces at least some functions of the first manipulation unit 123a provided on the front surface of the terminal body so the first manipulation unit 123a is omitted from the front surface of the terminal body, the display unit 151 can have a larger screen.

As a further alternative, the mobile terminal 100 may include a finger scan sensor which scans a user's fingerprint. The controller 180 can then use fingerprint information sensed by the finger scan sensor as part of an authentication procedure. The finger scan sensor may also be installed in the display unit 151 or implemented in the user input unit 123.

The microphone 122 is shown located at an end of the mobile terminal 100, but other locations are possible. If desired, multiple microphones may be implemented, with such an arrangement permitting the receiving of stereo sounds.

The interface unit 160 may serve as a path allowing the mobile terminal 100 to interface with external devices. For example, the interface unit 160 may include one or more of a connection terminal for connecting to another device (for example, an earphone, an external speaker, or the like), a port for near field communication (for example, an Infrared Data Association (IrDA) port, a Bluetooth port, a wireless LAN port, and the like), or a power supply terminal for supplying power to the mobile terminal 100. The interface unit 160 may be implemented in the form of a socket for accommodating an external card, such as Subscriber Identification Module (SIM), User Identity Module (UIM), or a memory card for information storage.

The second camera 121b is shown located at the rear side of the terminal body and includes an image capturing direction that is substantially opposite to the image capturing direction of the first camera unit 121a.

The second camera 121b can include a plurality of lenses arranged along at least one line. The plurality of lenses may also be arranged in a matrix configuration. The cameras may be referred to as an "array camera." When the second camera 121b is implemented as an array camera, images may be captured in various manners using the plurality of lenses and images with better qualities.

As shown in FIG. 1C, a flash 124 is shown adjacent to the second camera 121b. When an image of a subject is captured with the camera 121b, the flash 124 may illuminate the subject.

As shown in FIG. 1B, the second audio output module 152b can be located on the terminal body. The second audio output module 152b may implement stereophonic sound functions in conjunction with the first audio output module 152a, and may be also used for implementing a speaker phone mode for call communication.

At least one antenna for wireless communication may be located on the terminal body. The antenna may be installed in the terminal body or formed by the case. For example, an antenna which configures a part of the broadcast receiving module 111 may be retractable into the terminal body. Alternatively, an antenna may be formed using a film attached to an inner surface of the rear cover 103, or a case that includes a conductive material.

A power supply unit 190 for supplying power to the mobile terminal 100 may include a battery 191, which is mounted in the terminal body or detachably coupled to an outside of the terminal body.

The battery 191 may receive power via a power source cable connected to the interface unit 160. Also, the battery 191 can be recharged in a wireless manner using a wireless charger. Wireless charging may be implemented by magnetic induction or electromagnetic resonance.

The rear cover 103 is shown coupled to the rear case 102 for shielding the battery 191, to prevent separation of the battery 191, and to protect the battery 191 from an external impact or from foreign material. When the battery 191 is detachable from the terminal body, the rear case 103 may be detachably coupled to the rear case 102.

An accessory for protecting an appearance or assisting or extending the functions of the mobile terminal 100 can also be provided on the mobile terminal 100. As one example of an accessory, a cover or pouch for covering or accommodating at least one surface of the mobile terminal 100 may be provided. The cover or pouch may cooperate with the display unit 151 to extend the function of the mobile terminal 100. Another example of the accessory is a touch pen for assisting or extending a touch input to a touch screen.

Hereinafter, exemplary embodiments of the present disclosure that may be implemented in the mobile terminal configured as described above will be described with reference to the accompanying drawings. It will be obvious to a person skilled in the art that the present disclosure may be embodied to any other specified form within the scope of the spirit and essential characteristics of the present invention.

Figure 2A:
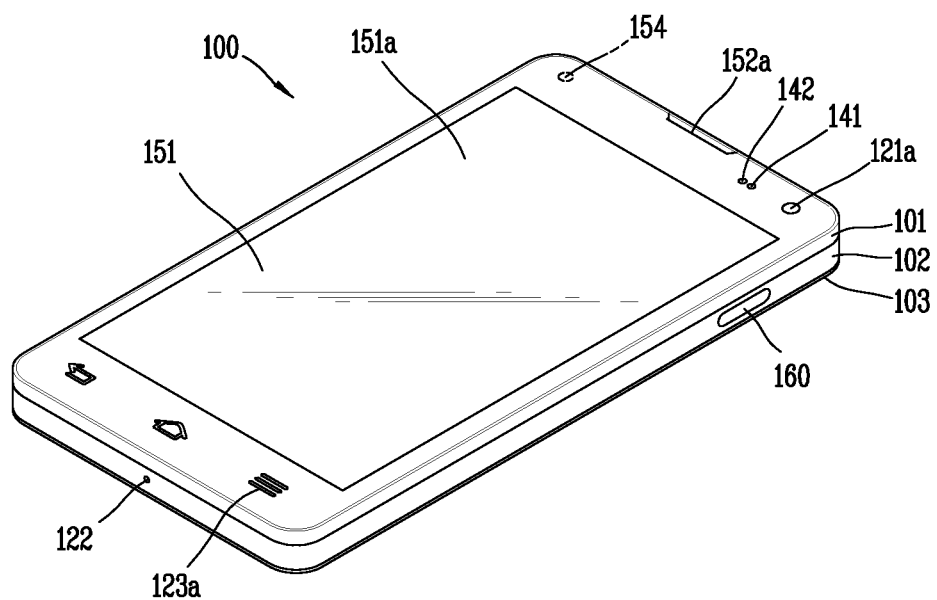
FIGS. 2A and 2B are conceptual views of one example of the mobile terminal, viewed from different directions.
Figure 3:
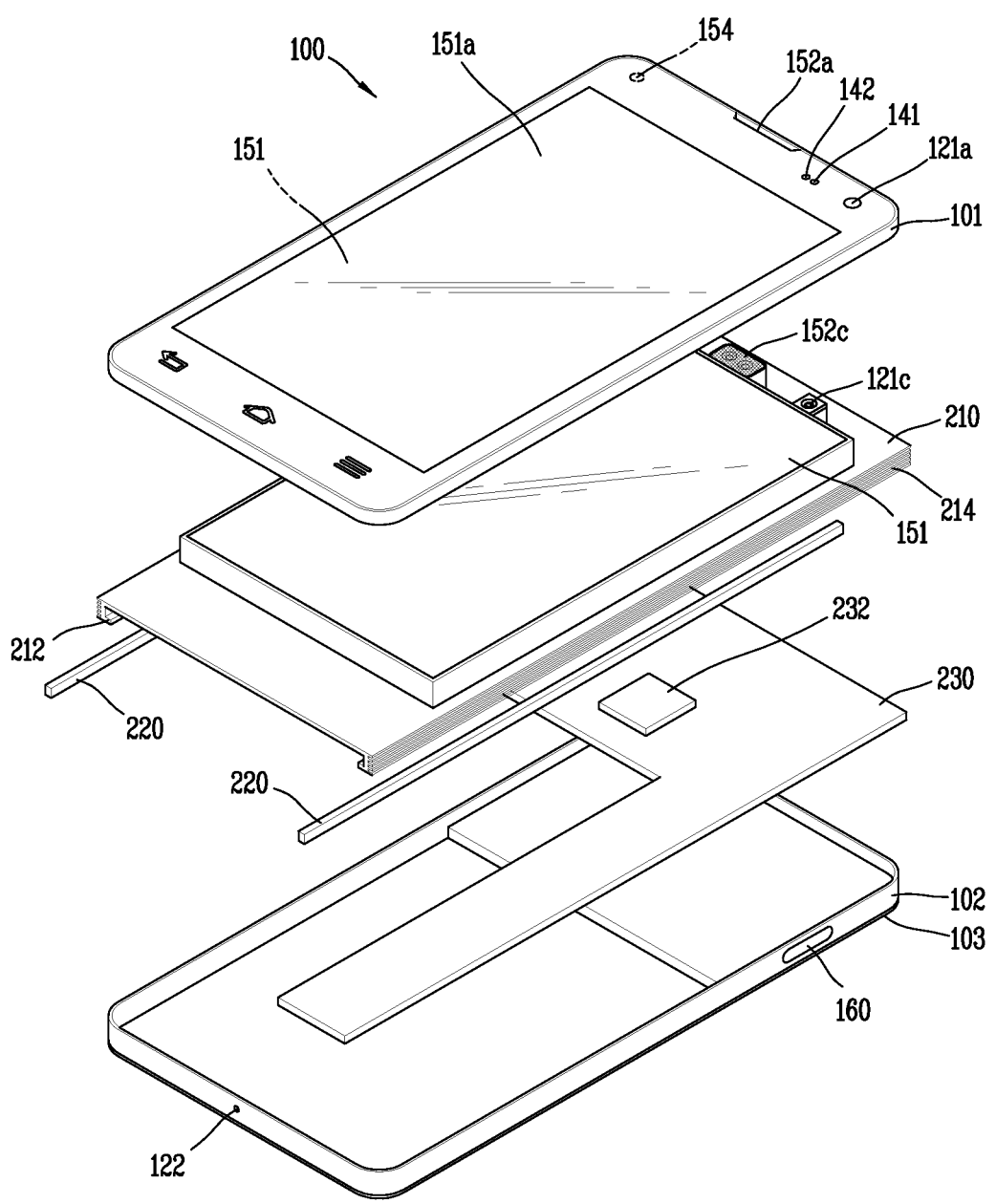
FIG. 3 is an exploded perspective view of the mobile terminal illustrated in FIG. 2A.

FIG. 3 is an exploded perspective view of the mobile terminal 100 illustrated in FIG. 2A.

A frame 210 and heat pipes 220 serve to dissipate heat generated by a heating element 232 mounted on a printed circuit board (PCB) 230 outwardly from the terminal body. In detail, the frame 210 and the heat pipes 220 are in contact by a predetermined area, and portions of the frame 210 cover the heat pipe 220. Through this structure, the heat pipes 220 may be supported by the frame 210 such that the heat pipes 220 are prevented from being released from the frame 210 due to impact based on external force. Also, a large contact area facilitates heat transmission from the frame 210 to the heat pipe 220.

The mobile terminal according to an exemplary embodiment of the present disclosure includes the PCB 230, the frame 210, and the heat pipes 220.

The PCB 230 is disposed within the terminal body. Also, the heating element 232 generating heat is disposed on the PCB 230. Unlike the configuration illustrated the drawing, a plurality of heating elements 232 may be mounted on the PCB 230. Also, the heating elements 232 may be provided on both upper and lower surfaces of the PCB 23.

The frame 210 may be disposed to be parallel with a front surface (i.e., a surface on which a window 151a is disposed) within the terminal body. The frame 210 may be formed of a metal allowing heat to be readily transmitted. A display unit is mounted on one surface of the frame 210, and the surface of the frame 210 forms a space in which the PCB is installed.

The heat pipes 220 may be supportedly disposed on one surface of the frame 210. The surface of the frame 210 on which the heat pipe 220 is disposed may be the opposite surface of the surface of the frame 210 on which the display unit 151 is disposed. Alternatively, the heat pipes 220 may be disposed on the surface on which the display unit 151 is disposed.

The heat pipe 220 is thermally connected to exchange heat with the PCB 230. Here, the connection may be made such that a material facilitating heat conduction is interposed to be in contact with the heat pipes 220 and the heating element 232, between the heat pipes 220 and the PCB 230 or between the heat pipes 220 and the heating element 232.

In order to dissipate heat generated by the heating element 232 outwardly from the terminal body, a portion of the heat pipes 220 absorbs heat generated by the heating element 232 and transmits the absorbed heat to another portion of the heat pipe 220.

The heat pipe 220 operates as follows. When heat is absorbed to one side of the heat pipe 220, a liquid within the heat pipe 2200 absorbs heat so as to be evaporated. Thereafter, the gas moves to a different position from the position where heat was absorbed. The gas is liquefied in the position to which it has been moved. Through the liquefaction, heat is released, and the heat is dissipated outwardly from the terminal.

The frame 210 includes a hold portion 212 extending from an end portion thereof. The hold portion 212 extends from one end portion of the frame 210 or from both ends portion of the frame 210. The hold portion 212 may be formed to surround at least a portion of the heat pipe 220. Thus, the heat pipe 220 is supported by the frame 210. Since the frame supports the heat pipe 220 through the hold portion 212, the heat pipe 220 may be prevented from being released from the frame 210 due to external force that may be applied to the terminal body. If the heat pipe 220 is released from the frame 210, the heat pipe 220 cannot properly serve to dissipate heat generated by the heating element 232 of the PCB 230 outwardly from the terminal body. This is because heat cannot be transmitted from the frame 210 the heat pipe 220.

Figure 4:
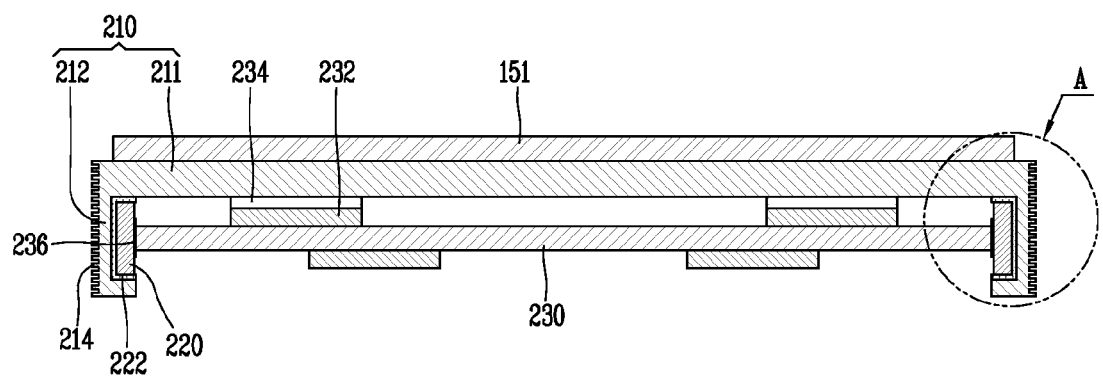
FIG. 4 is a cross-sectional view of the mobile terminal according to an exemplary embodiment of the present disclosure.

FIG. 4 is a cross-sectional view of the mobile terminal 100 according to an exemplary embodiment of the present disclosure.

The frame unit 210 includes a base portion 211 disposed to be parallel with a front surface of the terminal body and the hold portion 212 extending from the base portion 211.

The base portion 211 is disposed to be parallel with the front surface of the terminal body. The display unit may be disposed on one surface of the base portion 211. A space may be provided on the other surface of the base portion 211 to allow the PCB 230 to be installed therein.

The hold portion 212 may be bent and extend from the base portion 211 at a predetermined angle. Here, the hold portion 212 may be bent at an angle of approximately 90 degrees. The hold portion 212 may be bent twice. In detail, the hold portion 212 may be bent from the base portion 211 and extend by a predetermined distance, and bent again from an end of the extended portion and extend.

As the hold portion 212 is bent and extend from the base portion 211, a space surrounded on three sides by the base portion 211 and the hold portion 212 may be formed. The heat pipe 220 may be accommodated in the space. Namely, the base portion 211 and the hold portion 212 may be configured to supportedly accommodate the heat pipe 220. Also, since the hold portion 212 is bent and extends and is subsequently bent and extends again, the heat pipe 220 may be in contact with the hold portion 212 in at least three directions perpendicular to each other. Such contact in the three directions may firmly couple the hold portion 212 and the heat pipe 220.

As described above, the frame 210 may be formed of a metal facilitating heat transmission. In order for the frame 210 to transmit a large amount of heat to the heat pipe 220, the hold portion 212 may extend in a length direction of the frame 210. The length direction of the frame 210 is a direction penetrating through the drawing. Here, the extended length of the hold portion 212 may be equal to or shorter than the frame 210. As the hold portion 212 extends, the frame 210 and the heat pipe 220 may be in contact in a larger area, and accordingly, a larger amount of heat from the frame 210 may be readily transmitted to the heat pipe 220. Also, the hold portion 212 may extend in a width direction of the frame 210. This will be described in detail hereinafter.

The PCB 230 may be disposed in a lower end portion of the frame 210. In detail, the PCB 230 may be disposed in a space partitioned by the base portion 211 and the hold portion 212. Both ends of the PCB 230 are in contact with the heat pipes 220 and supported by the heat pipes 220. In consideration of the thickness of the heating element 232 mounted on the PCB 230, the PCB 230 is disposed on one surface of the base portion 211 such that it is spaced apart from the base portion 211 by a pre-set interval. The interval may be a distance over which the heating element 232 is not in contact with the base portion 211.

In order to easily transmit heat generated by the heating element 232 to the frame 210, a heat transmission portion 234 may be interposed between the heating element 232 and the frame 210. The heat transmission portion 234 may be formed of a thermal interface material. The heat transmission portion 234 may be provided to be in contact with the heating element 232 and the frame 210. Also, the heat transmission portion 234 may be formed to be elastically deformed to absorb impact that may be applied to the terminal body.

Figure 5:
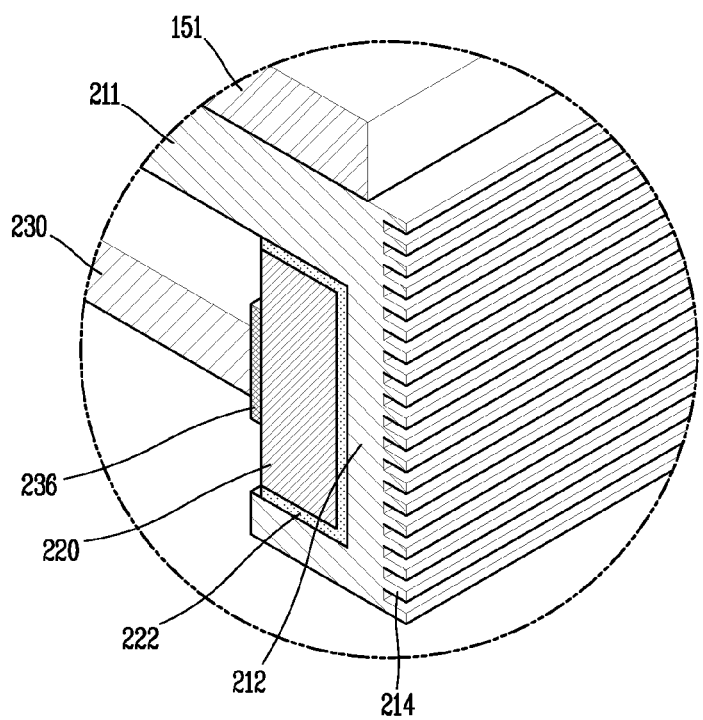
FIG. 5 is a conceptual view of a region 'A' of FIG. 4, viewed in a diagonal direction.

FIG. 5 is a conceptual view of a region 'A' of FIG. 4, viewed in a diagonal direction.

As described above, the hold portion 212 extends from the base portion 211 to form a space in which the heat pipe 220 is accommodated. A thermal grease 222 having adhesive strength may be disposed in the space to bond the heat pipe 220 to the frame 210. The thermal grease 222 may have excellent thermal conductivity, as well as adhesive strength, facilitating heat exchanging between the frame 210 and the heat pipe 220.

An elastic member 236 may be interposed between the PCB 230 and the heat pipe 220. The elastic member 236 may be formed to be elastically deformed to absorb impact applied from the outside. The elastic member 236 may be interposed in a compressed form between the PCB 230 and the heat pipes 220. Thus, the elastic member 236 may push the PCB 230 by compressive force. The elastic member 236 may press the heat pipe 220 toward the hold portion 212 by the compressive force. Namely, the elastic member 236 protects the frame 210, the heat pipe 220, and the PCB 230 from external force, and also, enables the PCB 230 to be firmly disposed below the frame 210. In addition, the elastic member 236 may enable the heat pipe 220 to be firmly installed in the hold portion 212.

The elastic member 236 may be formed of silicon, a thermal conductor, in order to transmit heat from the PCB 230 to the heat pipe 220. Due to heat generated by the heating element 232 mounted on the PCB 230, the PCB 230 may have a relatively high temperature. The PCB 230 may be formed of a material that may be able to easily transmit heat. Thus, heat generated by the heating element 232 may be directly transmitted to the heat pipe 220 through the PCB 230. In this process, the elastic member 236 interposed between the PCB 230 and the heat pipe 236 may be formed of silicon facilitating heat transmission.

A hair pin portion 214 formed to be repeatedly concave and convex may be formed in the hold portion 214. The hair pin portion 214 may be formed on an outer surface, rather than on an inner surface in contact with the heat pipe 220, in a thickness direction. Since the hair pin portion 214 increases a contact area with ambient air compared with the volume, and thus, it can readily dissipate heat introduced from the heat pipe 220 to the hold portion 212 or the frame 210 outwardly from the terminal body. Since the hair pin portion 214 is formed, heat transmission efficiency between the heat pipe 220 and the outside of the terminal can be enhanced.

Figure 6:
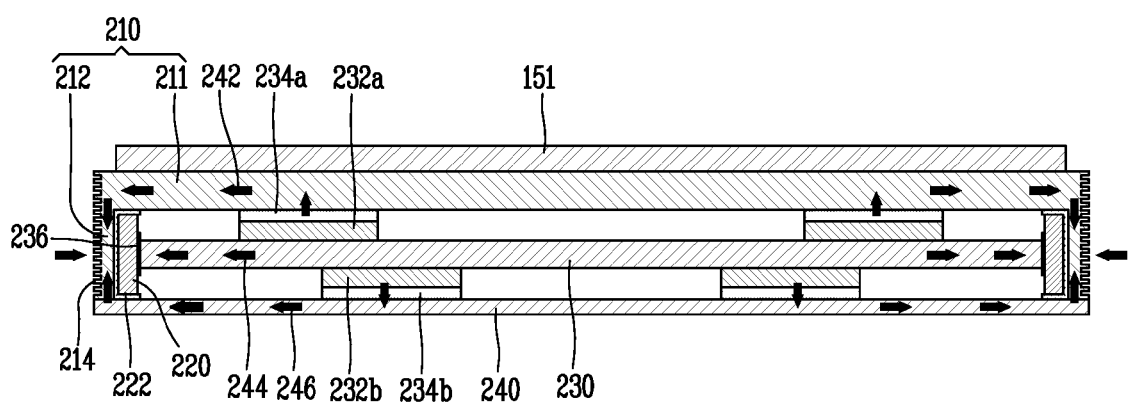
FIG. 6 is a cross-sectional view illustrating a configuration in which a rear cover is coupled to a hold portion of the mobile terminal according to an exemplary embodiment of the present disclosure.

FIG. 6 is a cross-sectional view illustrating a configuration in which a rear cover is coupled to a hold portion of the mobile terminal according to an exemplary embodiment of the present disclosure.

In describing the present exemplary embodiment, the same parts as those described above in the exemplary embodiment of FIG. 4 will be omitted.

Figure 2B:
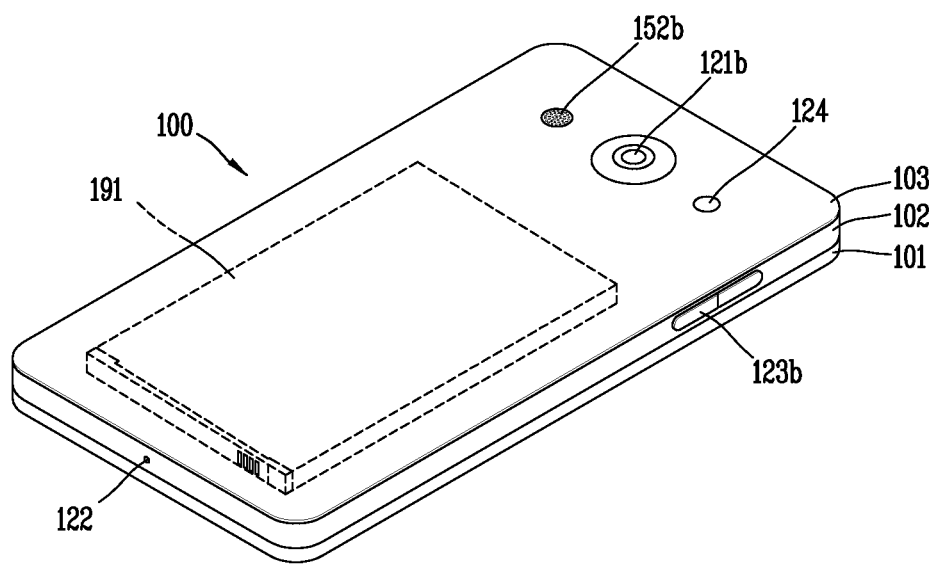

The mobile terminal 100 according to the present exemplary embodiment may further include a rear cover 240 disposed below the PCB 230 and coupled to the hold portion 212. The rear cover is coupled to the frame 210 such that the PCB 230 is not exposed. Here, the rear cover 240 may be the rear case 102 (please refer to FIG. 2B) or the rear cover 103 (please refer to FIG. 2B).

The rear cover 240 may be formed of a material that can easily transmit heat. Also, the rear cover 240 may be in contact with the heat pipe 220 such that heat generated by the heating element 232 is transmitted to the heat pipe 220. In this case, as illustrated, the hold portion 212 may be bent once and extend. Alternatively, unlike the configuration illustrated in the drawing, the hold portion 212 may be bent twice and extend and the rear cover 240 may be in contact with the hold portion 212 to transmit heat.

The heating element 232 includes a first heating element 232 mounted on a surface of the PCB 230 facing the base portion 211, among the surfaces of the PCB 230, and a second heating element 234 mounted on a surface of the PCB 230 facing the rear cover 240.

The heat transmission portion 234 includes a first heat transmission portion 234a interposed between the first heating element 232 and the base portion 211 and disposed to be in contact with the first heating element 232 and the base portion 211 and a second heat transmission portion 234b interposed between the second heating element 232 and the rear cover 240 and disposed to be in contact with the second heating element 232 and the rear cover 240.

Heat generated by the heating element 232 may be transmitted to the heat pipe 220 through three paths. A first path 242 is a path along which heat generated by the first heating element 232 is transmitted to the base portion 211 through the first heat transmission portion 234a and transmitted to the heat pipe 220 through the base portion 211. A second path 244 is a path along which heat generated by the first and second heating elements 232a and 232b are directly transmitted to the heat pipe 220. A third path 246 is a path along which heat generated by the second heating element 232b is transmitted to the rear cover 240 through the second heat transmission portion 234b and heat transmitted to the rear cover 240 is transmitted to the heat pipe 220.

Through the various paths as described above, heat from within the terminal body can be quickly and effectively lowered. Also, since the first heat transmission portion 234a and the second heat transmission portion 234b are in contact with the PCB 230 in a vertical direction to fix the PCB 230, the PCB 230 can be more stably disposed below the base portion 211.

Figure 7A:
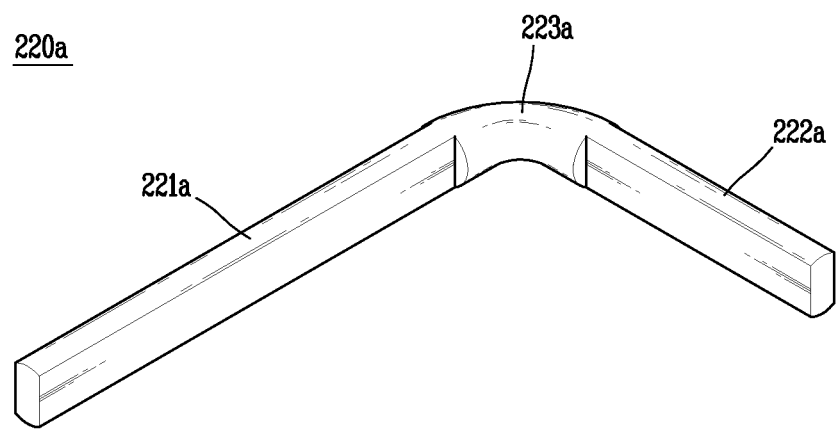
FIGS. 7A and 7B are conceptual views illustrating configurations of heat pipes according to exemplary embodiments of the present disclosure.
Figure 7B:
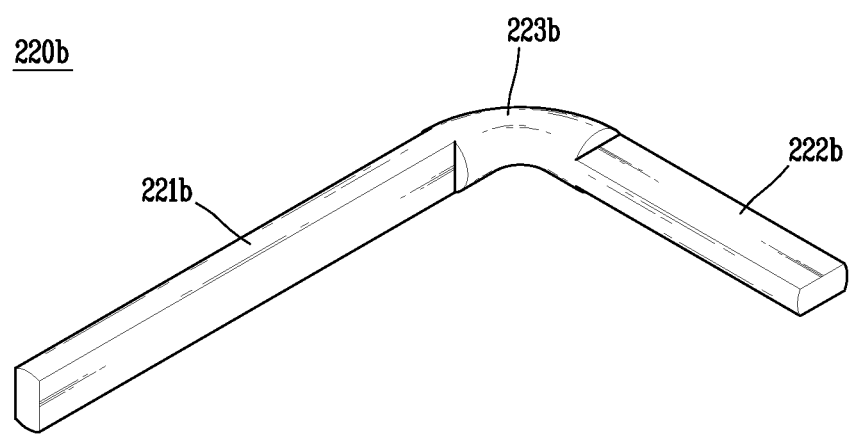

FIGS. 7A and 7B are conceptual views illustrating configurations of heat pipes according to exemplary embodiments of the present disclosure.

A heat pipe 220a illustrated in FIG. 7A includes a first portion 221a extending in one direction, a second portion 222a bent to extend in a direction perpendicular to the one direction, and a third portion 223a connecting the first portion 221a and the second portion 222a. The first portion 221a and the second portion 222a of the heat pipe 220a have a rectangular shape in which a length in a length direction based on the drawing is longer than a length in a width direction. The third portion 223a may be a portion corresponding to a corner of the terminal body and may have a cylindrical shape. However, unlike the shape illustrated in the drawing, the third portion 223a may also have a rectangular shape.

A heat pipe 220b illustrated in FIG. 7B may include first, second, and third portions 221b, 222b, and 223b like the heat pipe of FIG. 7A. The heat pipe 220b is different from the heat pipe 220a, in that the first portion 221b has a rectangular shape formed to extend in a length direction based on the drawing and the second portion 222b has a rectangular shape formed to extend in a width direction. The second portion 222b may be positioned in an upper end portion or a lower end portion of the terminal body in a length direction. Also, audio output units 152a and 152b (please refer to FIGS. 2A and 2B), an antenna, or a terminal units may be disposed on the upper end portion or the lower end portion of the terminal body. Thus, in order to increase space utilization of the upper end portion or the lower end portion, the cross-sections of the heat pipe may be varied depending on positions.

Figure 8:
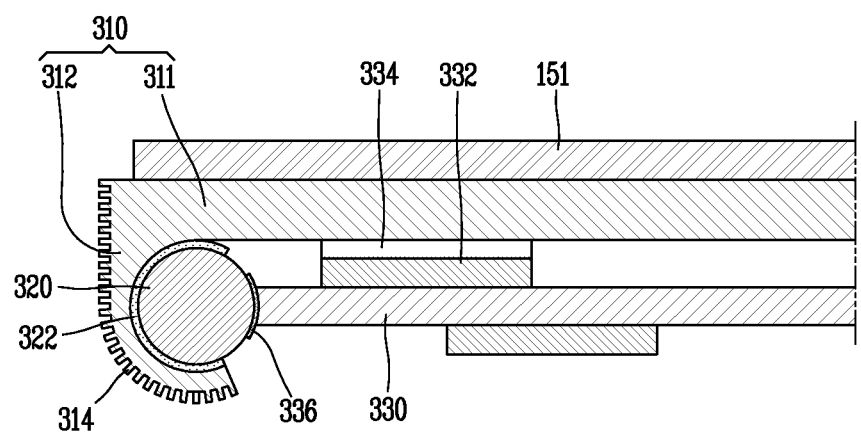
FIG. 8 is a conceptual view illustrating a cross-section of a mobile terminal according to another exemplary embodiment of the present disclosure.
Figure 9:
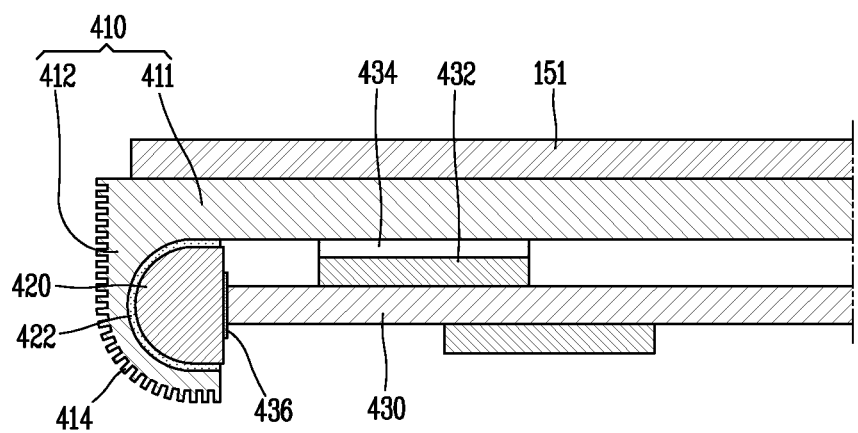
FIG. 9 is a conceptual view illustrating a cross-section of a mobile terminal according to another exemplary embodiment of the present disclosure.

FIG. 8 is a conceptual view illustrating a cross-section of a mobile terminal according to another exemplary embodiment of the present disclosure, and FIG. 9 is a conceptual view illustrating a cross-section of a mobile terminal according to another exemplary embodiment of the present disclosure.

In describing the present exemplary embodiment, components identical to those of the exemplary embodiment of FIG. 4 will be omitted.

Exemplary embodiments of FIGS. 8 and 9 are different in the shapes of heat pipes and the bent hold portions.

First, referring to FIG. 8, as described above, a hold portion 312 may be bent and extend at a predetermined angle with respect to the base portion 311. A heat pipe 320 may have a circular shape. In order for the hold portion 312 to form a space for accommodating the heat pipe 320, the hold portion 312 may extend with curvature. The hold portion 312 may be bent and extend such that it corresponds to the curve of the heat pipe 320. Unlike the configuration illustrated in the drawing, a hair pin portion 314 may not be provided.

Referring to FIG. 9, a heat pipe 420 may have a shape closed to a semi-circular shape. Thus, a hold portion 412 is bent to have a shape close to a semi-circular shape to accommodate the heat pipe 420.

In the exemplary embodiments of FIGS. 8 and 9, the hold portions 312 and 412 may commonly extend to cover the heat pipes 320 and 420 such that the hold portions 312 and 412 are in contact with the heat pipes 320 and 420 in three directions perpendicular to each other. This is to prevent the heat pipes 320 and 420 from being released from the space formed by the base portions 311 and 411 and the hold portions 312 and 412.

Figure 10:
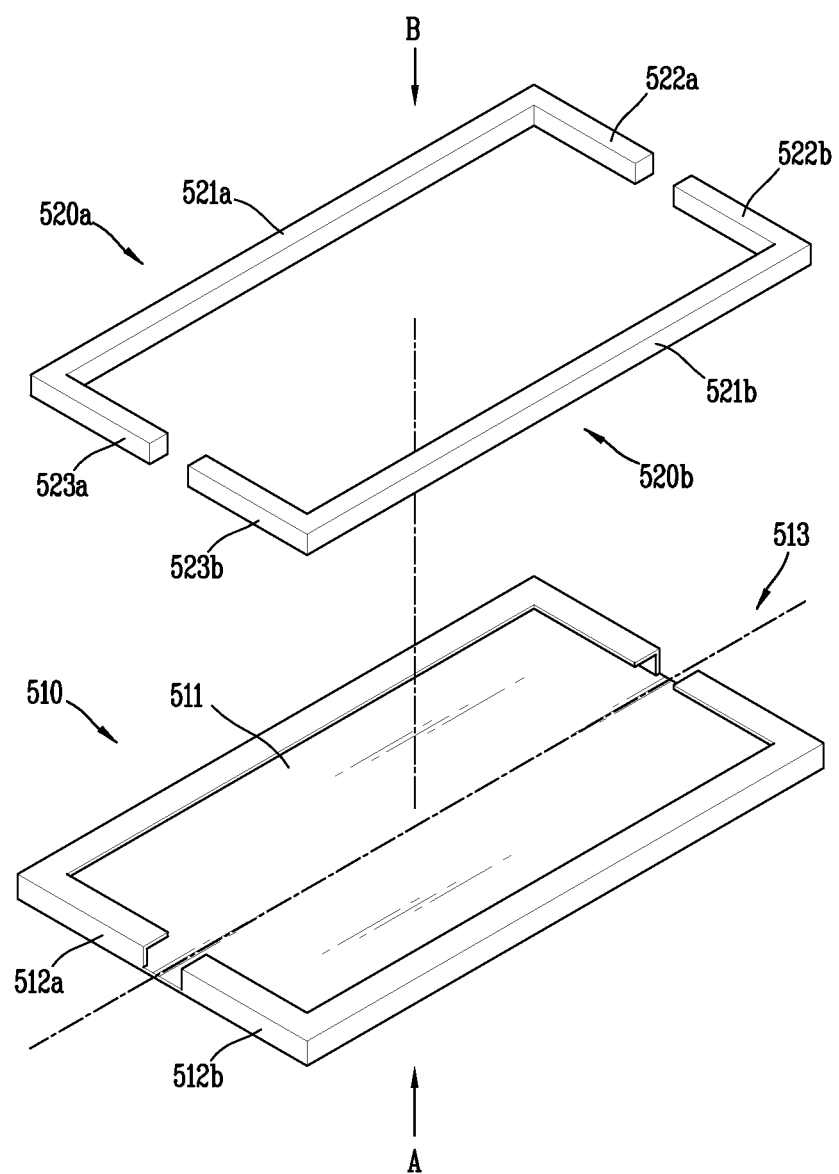
FIG. 10 is an exploded perspective view illustrating a frame and a heat pipe according to another exemplary embodiment of the present disclosure.
Figure 11:
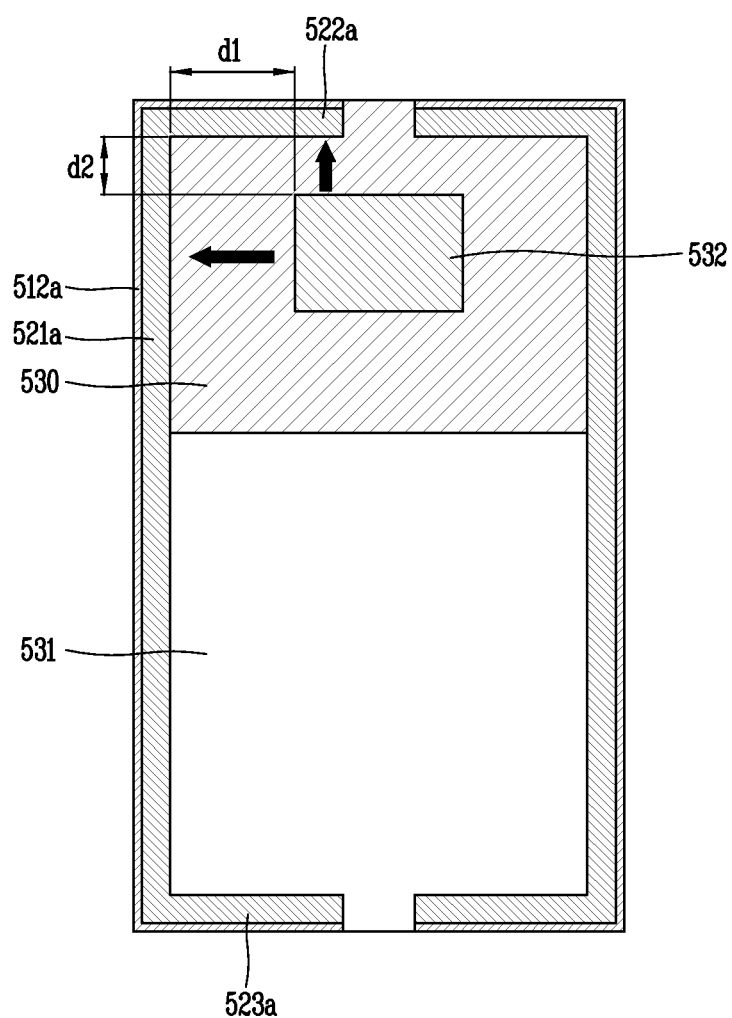
FIG. 11 is a plan view illustrating disposition of the frame, the heat pipe, and a printed circuit board (PCB) illustrated in FIG. 10.

FIG. 10 is an exploded perspective view illustrating a frame 510 and a heat pipe 520 according to another exemplary embodiment of the present disclosure, and FIG. 11 is a plan view illustrating disposition of the frame 510, the heat pipe 520, and a printed circuit board (PCB) 530 illustrated in FIG. 10.

In describing the present exemplary embodiment, in order to help understand the exemplary embodiment, a frame 510 and a PCB 530 of FIG. 10 are illustrated as being reversed, unlike those of FIG. 3. In other words, a display unit disposed on the frame 510 is disposed in the A direction. The PCB 530 is disposed in the B direction.

First, referring to FIG. 10, in order to reduce a distance over which heat is transmitted between a heating element 532 of the PCB 530 and a heat pipe 520, a hold portion 512 extends in a width direction of the frame 510 from both end portions of the frame 510 in a length direction. However, unlike the illustrated configuration, the hold portion 512 may extend only from one end portion of the frame 510 in the width direction of the frame 510.

A plurality of hold portions 512 may be formed. First and second hold portions 512a and 512b may be formed to be spaced apart from both end portions of the frame 510 in the width direction. Also, a plurality of heat pipes 520 may be provided and accommodated in a space formed by the hold portion 512 and the base portion 511.

In order to effectively dissipate heat transmitted from the heating element 532, outwardly from the terminal body, the first and second hold portions 512a and 512b may be formed to be symmetrical based on an axis 513 traversing the center of the frame 510 in the width direction. Accordingly, the first and second hold portions 512a and 512b may stably coupled to other components and more effectively dissipate heat generated by the heating element 532 outwardly.

Referring to FIG. 11, the heating element 532 is disposed on the PCB 530. The heat pipe 520 includes first, second, and third pipes 521a, 522a, and 523a.

The first heat pipe 521a is disposed at an end portion of the frame 510 in a width direction and formed in a length direction of the frame 510. The second pipe 522a extends from one end of the first pipe 521a in the width direction of the frame 510 and disposed to be in proximity to the heating element 532. The third pipe 523a extends from an end portion of the first pipe 521a, other than the end portion where the second pipe 522a is formed, in the width direction.

As illustrated, the second pipe 522a is disposed to be closer to the heating element 532, than other pipes. Namely, a distance between the first pipe 521a and the heating element 532 is d1, and a distance between the second pipe 522a and the heating element 532 is d2. When temperatures are similar, a larger amount of heat is transmitted to a closer position. Thus, as for the heat generated by the heating element 532, an amount of heat transmitted through the second pipe 522a is greater than an amount of heat transmitted through the first pipe 521a. Heat transmitted to the second pipe 522a may pass through the first pipe 521a and be dissipated outwardly from the terminal body through the third pipe 523a. Also, while heat passes through the first pipe 521a, heat may be outwardly dissipated from the terminal body through the hair pin portion 214 (please refer to FIG. 5).

Alternatively, the heating element 532 may be disposed in other position of the region of the PCB 530. In this case, heat generated by the heating element 5332 may be transmitted to a closer heat pipe 520.

Figure 12:
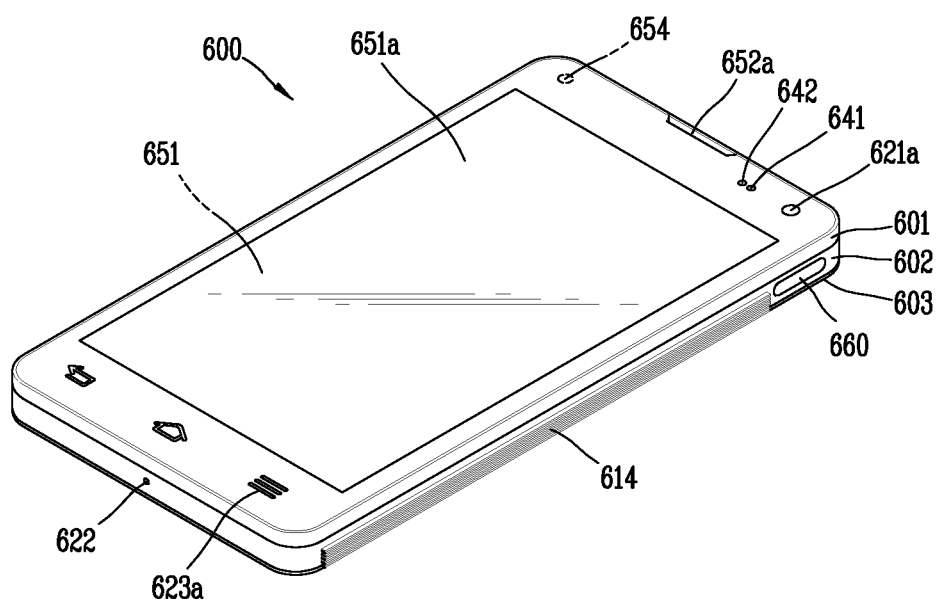
FIG. 12 is a conceptual view illustrating a mobile terminal according to another exemplary embodiment of the present disclosure.

FIG. 12 is a conceptual view illustrating a mobile terminal 600 according to another exemplary embodiment of the present disclosure.

Referring to FIG. 12, a hair pin portion 614 may be exposed to outside of the terminal body and form a portion of an appearance of the terminal body. The hair pin portion 614 may be exposed to both sides in the length direction among the sides of the terminal body. As illustrated, a frame may substitute a portion of the rear case 602.

When the hair pin portion 614 forms a portion of an appearance of the terminal body, the user may grip the concavo-convex portion of the hair pin portion 614. In this case, a grip of the terminal body may be enhanced. Also, since the hair pin portion 614 is directly in contact with ambient air, heat from the interior of the terminal body may be more promptly dissipated. Also, various patterns may be added to the hair pin portion 614 to enhance an aesthetic sense of the mobile terminal 600.

In addition, in a case in which the hair pin portion 614 forms a portion of the appearance of the terminal body, a blocking unit (not shown) for preventing current from flowing from the interior of the terminal body through the hair pin portion 614 may need to be formed.

According to at least one of the exemplary embodiments of the present disclosure, since the heat pipe is supported by the frame and surrounded by the hold portion, the heat pipe cannot be released from the frame even over external impact applied to the terminal body, providing a stable structure.

Also, according to at least one of the exemplary embodiments of the present disclosure, since the hold portion and the heat pipe continue to be in contact with the frame in the length direction of the frame, a large amount of heat can be effectively transmitted.

Also, according to at least one of the exemplary embodiments of the present disclosure, since the elastic member formed to be elastically deformed is interposed between the PCB and the heat pipe, impact that may be applied to the PCB and the heat pipe may be absorbed by the elastic member.

Also, according to at least one of the exemplary embodiments of the present disclosure, since the hair pin portion forms a portion of the appearance of the terminal body and is exposed to ambient air, heat from the interior of the mobile terminal can be quickly dissipated. Also, since the hair pin portion is disposed on the side of the terminal body, a grip of the terminal body can be enhanced.

The present invention described above may be implemented as a computer-readable code in a medium in which a program is recorded. The computer-readable medium includes any type of recording device in which data that can be read by a computer system is stored. The computer-readable medium may be, for example, a hard disk drive (HDD), a solid state disk (SSD), a silicon disk drive (SDD), a ROM, a RAM, a CD-ROM, a magnetic tape, a floppy disk, an optical data storage device, and the like. The computer-readable medium also includes implementations in the form of carrier waves (e.g., transmission via the Internet). Also, the computer may include the controller 180 of the terminal. Thus, the foregoing detailed description should not be interpreted limitedly in every aspect and should be considered to be illustrative. The scope of the present invention should be determined by reasonable interpretations of the attached claims and every modification within the equivalent range are included in the scope of the present invention.

What is claimed is:

1. A mobile terminal comprising:
    a printed circuit board (PCB) disposed within a terminal body and having a heating element which generates heat mounted thereon;
    a frame having a space formed on one surface thereof and allowing the PCB to be installed therein; and
    a heat pipe supported by the frame, disposed on one surface of the frame, and connected to the PCB to dissipate heat generated by the heating element outwardly from the terminal body,
    wherein the frame includes:
    a hold portion extending from a first end portion thereof to cover at least a portion of the heat pipe in order to prevent the heat pipe from being released from the frame by external force applied to the terminal body; and,
    a base portion disposed to be parallel with a front surface of the terminal body,
    wherein the hold portion extends from the base portion by a predetermined angle, and the base portion and the hold portion support the heat pipe, and
    wherein a portion which is repeatedly concave and convex is formed on a surface of the hold portion in order to increase heat transmission efficiency between the heat pipe and the terminal through the hold portion.

2. The mobile terminal of claim 1, wherein the hold portion is in contact with the heat pipe in at least three directions perpendicular to each other, and extends to cover the heat pipe.

3. The mobile terminal of claim 1, wherein the frame is formed of a metal to transmit heat transmitted from the heating element to the heat pipe.

4. The mobile terminal of claim 3, wherein the hold portion extends from an end portion of the frame such that the area in which the frame and the heat pipe are in contact is increased.

5. The mobile terminal of claim 4, wherein the hold portion and the heat pipe are provided on both the first end portion and a second end portion of the frame.

6. The mobile terminal of claim 1, wherein a thermal grease is disposed between the frame and the heat pipe such that the heat pipe and the frame are attached and transmit heat to each other.

7. The mobile terminal of claim 1, wherein both ends of the PCB is supported by the heat pipe and disposed on one surface of the base portion such that the PCB is spaced apart from the base portion by a predetermined interval.

8. The mobile terminal of claim 7, wherein a heat transmission portion is interposed between the heating element and the frame to transmit heat generated by the heating element to the frame.

9. The mobile terminal of claim 7, wherein an elastic member is interposed between the PCB and the heat pipe and formed to be elastically deformed to absorb external force.

10. The mobile terminal of claim 8, wherein the elastic member is silicon as a thermal conductor to transmit heat from the PCB to the heat pipe.

11. The mobile terminal of claim 1, wherein the hold portion comprises an extending portion extending from the first end portion of the frame towards a second end portion of the frame.

12. The mobile terminal of claim 11, wherein the hold portion is first and second hold portions formed to be spaced apart from one another at both the first end portion and the second end portion of the frame.

13. The mobile terminal of claim 12, wherein the first and second hold portions are formed to be symmetrical based on any one axis in order to effectively dissipate heat transmitted from the heating element outwardly from the terminal body.

14. The mobile terminal of claim 1, wherein the portion which is repeatedly concave and convex forms a portion of an appearance of the terminal body.

15. A mobile terminal comprising:
    a printed circuit board (PCB) disposed within a terminal body and having a heating element which generates heat mounted thereon;
    a frame having a space formed on one surface thereof and allowing the PCB to be installed therein;
    a heat pipe supported by the frame, disposed on one surface of the frame, and connected to the PCB to dissipate heat generated by the heating element outwardly from the terminal body; and
    a rear cover disposed below the PCB,
    wherein the frame includes:
    a hold portion extending from a first end portion thereof to cover at least a portion of the heat pipe in order to prevent the heat pipe from being released from the frame by external force applied to the terminal body; and
    a base portion disposed to be parallel with a front surface of the terminal body,
    wherein the hold portion extends from the base portion by a predetermined angle, and the base portion and the hold portion support the heat pipe, and
    wherein the rear cover is coupled to the hold portion.

16. The mobile terminal of claim 15, wherein the rear cover is in contact with the heat pipe to transmit heat generated by the heating element to the heat pipe.

17. The mobile terminal of claim 16, wherein the heating element comprises:
    a first heating element mounted on a surface facing the frame; and a second heating element mounted on a surface facing the rear cover,
wherein the second heating element and the rear cover are in contact with a heat transmission portion interposed therebetween in order to allow heat generated by the second heating element to be transmitted to the rear cover.

* * * * *